United States Patent [19]

O'Neill et al.

[11] 4,333,696
[45] Jun. 8, 1982

[54] PLURAL EDGE P.C. BOARD INTERCONNECTION

[75] Inventors: Joseph L. O'Neill, Haddonfield, N.J.; Christopher J. Scafidi, Marlton, N.J.

[73] Assignee: Infotron Systems Corporation, Cherry Hill, N.J.

[21] Appl. No.: 160,846

[22] Filed: Jun. 19, 1980

[51] Int. Cl.³ .............................................. H05K 1/00
[52] U.S. Cl. .............................................. 339/17 LM
[58] Field of Search ............ 339/17 LM, 17 M, 17 N, 339/74 R, 75 MP, 65, 66

[56] References Cited

U.S. PATENT DOCUMENTS 2,955,236 10/1960 Luhn ........................ 339/17 LM X
4,179,172 12/1979 Godsey et al. ................ 339/17 LM
4,232,356 11/1980 Saunders et al. ............... 361/412 X Primary Examiner—John McQuade
Assistant Examiner—Frank H. McKenzie, Jr.

[57] ABSTRACT

A packaging scheme for an expandable electronic system or sub-system unit which minimizes cabinet interconnection structure whereby electrical signal connections are bifurcated and may be made to and from electronic component carrying printed circuit boards, whereof, inter-board connections may be made off of one edge of each board while input/output interface connections may be made off of another edge of each board.

15 Claims, 6 Drawing Figures

PLURAL EDGE P.C. BOARD INTERCONNECTION

BACKGROUND OF THE INVENTION

This invention relates to printed circuit board (P.C. board) connections and cabinet wiring for data processing and data handling modules and incorporates inter and intra unit electrical signal connections.

In the past various schemes have been used for making electrical connections to and within electronic units and modules used in computers systems, data handling systems, telephonic and communications equipment and controllers and control systems. Every electronic design involving quantities of electronic components involves a packaging structure of one sort or another. Typically, discrete components such as capacitors and resistors, intergrated circuit chips and MOS chips, including small through large scale intergrated circuits, are mounted on printed circuit boards (P.C. boards) for ease of assembly and handling. These P.C. boards are normally mounted in cabinets, on racks, and electrically interconnected off of the rear or back plane of each board. Such interconnections carry all of the electrical signals between each P.C. board as well as interface signals out of the cabinet, usually through the back panel, to interconnect with other units or with the customer. Early in the development of computer and controller packaging, multiple stand-off pin connectors, pin-socket connectors and ribbon connectors came into popular use.

Previously, each P.C. board had either a ribbon connector formed by parallel strips of solder on the card or had a socket-pin type connector, either of which provided the electrical connection to the back plane of the P.C. board.

Whether a P.C. board ribbon or pin connector is utilized, a row of female connectors is usually mounted to the back panel of the cabinet for receiving each and every possible P.C. board mounted in the unit. Inter-board connections are then wire wrapped from stand-offs associated with the receiving back panel connectors. Large wiring harnesses are built up to carry signals between boards, as well as, to the cabinet interface (input-output) connectors. Signals, as well as, grounds and power supply voltages are also carried through such wiring.

The utilization of such a connection and wiring structure forces certain economic considerations on the manufacturer. Each cabinet or unit must be fully wired at the factory at the time of original construction in order to allow for the expandability of the unit by the adding of additional P.C. board capability at a later time. The later wiring in individual P.C. board connections is extremely costly, so as to be prohibative. As a result, the manufacturer is forced to supply, and the purchaser pay for, much more wiring, connectors and connector hardware in an expandable, entry level or lower level system than is necessary.

As popular as the above discussed wiring schemes are, they require an expandable module to contain a full compliment of fully wired back panel connectors for handling each and every P.C. board for which the unit is capable, regardless of whether the unit is purchased with that full capability or not. With mass production techniques and economies of scale practices, entry level unit costs have been escalated due to the standardized wiring capability of each unit regardless of whether the customer has a need or even a desire for the expansion capability.

There have also been packaging schemes, where P.C. boards and the attendant wiring thereto can be added, individually, later. These involve a male pin connector attached to the board and a female pin connector is bolted to the back panel. However, when this structure is utilized it is also necessary to bolt the female and male connectors together via their flanges or other protrusions in order to assure that once the P.C. board is connected, it does not accidentally pull free. Such a structure is cumbersome and unpopular as it requires the bolting and unbolting of each P.C. board and/or the disconnecting of user's cables during maintenance which is awkward and time consuming, adding to costs as well as creating a potential hazard when a technician inserts a tool into the cabinet or when cable connections are mixed-up upon reconnection.

An object of this invention is to provide a cabinet and P.C. board interconnection structure which reduces the amount of connection hardware for entry level units having planned expansion capabilities.

A second object of this invention is to provide such an interconnection structure whereby inter P.C. board connections are made off of one edge or plane of each P.C. board while interface (input/output) connections are made off of another edge or plane.

Another object of this invention is to provide such an interconnection structure whereby inter P.C. board connections are prewired into the unit's cabinet at the time of original assembly, the connection apparatus for inter P.C. board connections incorporating a locking mechanism for locking each P.C. board securely in place once it has been inserted.

A further object of this invention is to provide such an interconnection structure where additional back panel interface (I/O) connectors may be easily added after the original assembly, permitting the addition of other P.C. boards to the cabinet in order to enlarge the capability of the unit.

An even further object of the invention is to provide such an interconnection structure where customer or foreign unit interface connectors mount externally to the cabinet back panel, and an assembly and alignment structure enables each P.C. board bearing its individual interface connector to be quickly and correctly inserted and aligned for proper electrical connection with such customer or foreign unit connector and just as easily released therefrom.

SUMMARY OF THE INVENTION

The objects of this invention are realized in a packaging structure for a computer, multiplexer or other electronic or data handling unit having circuitry mounted on P.C. boards housed in a cabinet, this cabinet having additional space for expansion of electronic capabilities by the addition of P.C. boards.

A rectangular cabinet structure may be utilized to house a plurality of P.C. boards mounted in racks comprising guides and rails. Inter-board electrical connections may be made through an individual printed wiring board or other apparatus, internal and originally installed into the cabinet. Electrical connection to this wiring harness or other suitable apparatus may be made from one edge of each P.C. board, such as the top plane, through a ribbon or other suitable connector.

P.C. boards are accessed or inserted through the front of the cabinet; a quick release cabinet mounted locking mechanism may be utilized to electrically engage each P.C. board top plane connector and securely hold it in the rack.

The back panel of the cabinet may contain a plurality of openings or punchouts for receiving customer or external connectors securely mounted to the external face of the back panel.

Each P.C. board guide may be aligned with one or more of these connector openings for perfectly mating a P.C. board to an externally mounted back panel connector. Each P.C. board may, thus at its back plane edge contain a pin type connector when the back panel connectors are pin type. This pin connector extends beyond the back plane of each board to extend through a back panel opening to mate with a connector mounted thereto.

Locating apparatus may be incorporated onto the back panel to assure that each P.C. card back plane connector aligns with the openings thereof, perfectly. Mounting hardware may also be incorporated into the back panel for positioning externally mated connectors at the back plane openings. Thus, external connectors are positioned and locked within the cabinet assuring lasting positive electrical connection.

Each P.C. board may contain at least one slot or cutout at its top plane surface for engaging a quick release locking mechanism. The precise location of such slot assures the precise insertion to depth for each P.C. board and proper connection of both the top plane and back plane connectors.

DESCRIPTION OF THE DRAWINGS

The novel structure, features and advantages of this invention will be readily understood from a reading of the following detailed description of the invention in conjunction with the attached drawings in which like numerals refer to like elements, and wherein.

DETAILED DESCRIPTION OF THE INVENTION

Figure 1:
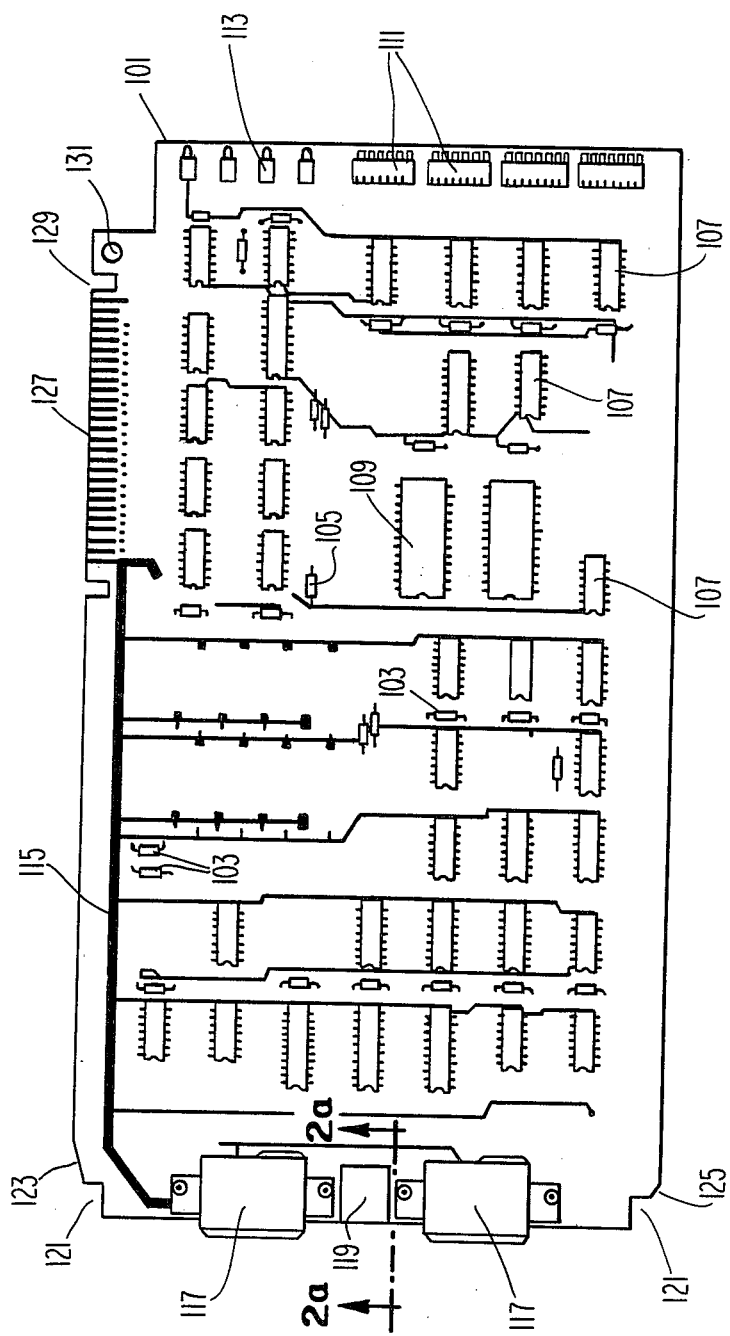
FIG. 1 is a plan view of a P.C. board used in the invention.

A plural edge P.C. board interconnection structure, for an expandible capacity data handling or other electronic unit, using electronic components mounted to printed circuit boards (P.C. boards) held in racks in a cabinet, utilizes a plurality of P.C. boards, one of which is shown in FIG. 1. These P.C. boards 101 each hold the electronic components, such as discrete capacitors 103, resistors 105, dual-in-line, 16 pin "chips" 107 and 28 pin memory and MSI/LSI "chips" 109; as well as other components, such as selectors 111 and indicators lights 113. Each board 101 contains at least one layer of solder lines 115, laid out in ribbons on the face and/or the backside of the board 101.

The board 101 is of essentially a rectangular shape. Positioned at a back plane edge of the board 101 are a pair of socket-pin connectors 117, rivet mounted to extend beyond the back plane edge of the card 101 to act in parallel as interface (input/output) connectors for the board 101 and the cabinet of which the board 101 is a component. The pin-type connectors 117 may be purchased from AMP Corporation, Harrisburg, Pa., and are typically identified as EIA type connectors.

EIA connectors are certified by the Electronic Industries Association (EIA). The connectors 117 each have 25 pins and meet standard RS-232-C. This is the industry standard for data terminals and data communication equipment interfaces.

Mounted to the P.C. board 101 and positioned adjacent to and between the EIA-type connectors 117 is a locator block 119. This locator block 119 is rectangularly shaped and has a face adjacent to the back plane of the board 101.

The back plane of each P.C. board 101 contains cutouts 121 at the corners which define a protruding portion on which the pin connectors 117 and locator block 119 are mounted as separate from the circuit component portion. The top plane insertion edge of each board 101 is chamfered 123, at a shallow angle of about 4 to 5 degrees. The bottom plane leading edge may contain a 45 degree chamfer 125. The shallow, top plane chamfer 123 allows for a slight canting of each board 101 during insertion and removal of the board from the cabinet guides, facilitating ease of insertion.

A dual 28 strip ribbon connector 127 is situated at the top plane of the board 101. This ribbon connector 127 may be positioned anywhere along the top plane edge of each board 101, but is more conveniently located at or near the following edge of the board which therefore will locate it near the front of the cabinet. Ribbon connector 127 provides 56 ribbon connection strips, 28 on each side of the P.C. board 101, making inter-board connections internal to the cabinet. These ribbon strips or fingers are "fatter" than with normal ribbon connectors. In this invention they are nominally 0.10 inches wide rather than 0.05–0.07 inches.

A rectangular slot 129 extends downwardly from the top plane adjacent the ribbon connector 127 and is of a precise size and location for exactly positioning and locking the ribbon connector 127 with respect to the back plane of the board 101 and the cabinet connectors used for mating with the ribbon connector 127. This will be discussed in more detail below.

A finger hole 131 is positioned trailing and adjacent to the positioning and locking slot 129 and it can be used to pull the board 101 from the cabinet.

Figure 2A:
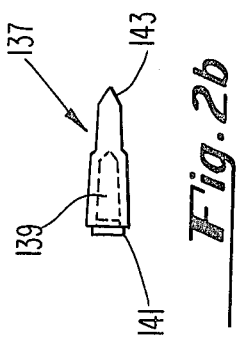
FIG. 2a is a side elevation of a locator block on the P.C. board in FIG. 1 and positioned on each P.C. board adjacent to the back plane connector(s).

A locator block 119 can be mounted to the P.C. board 101, FIG. 2a, with a screw inserted from the back of the P.C. board 101. A locator block 119 contains a through hole 133 which extends through the positioning block 119 parallel to the back plane face of P.C. board 101, being essentially located in the middle of the block 119. This hole 133 has a beveled portion 135 at the back plane edge of the P.C. board 101.

Figure 2B:
FIG. 2b shows a locator pin, matable with the locator block of 2a, this locator pin being mounted to the back panel of the cabinet.

This beveled portion 135 has been incorporated for ease of mating with a locator pin 137, FIG. 2b, which is mounted to the back panel of the cabinet providing engagement of even severely warped printed wiring boards. A locator pin 137 is essentially round or barrel shaped. Locator pin 137 has a drilled and tapped hole 139 extending thereinto from its base. The base of the locator pin 137 has been undercut to provide a projecting shoulder 141 which positively positions the locator pin 137 on the back panel of the cabinet as it "neatly" meets a precision drilled hole. The leading end of the locator pin 137 has a reduced cross section which tapers to a point 143. This reduced cross section can have one or more flats formed thereon enabling the grasping of pin 137 during assembly.

The locator block 119 and a locator pin 137 can be made out of any of a plurality of materials. However, it is advantageous to mold them out of a fiberglass loaded "plastic" material such as Lexan* as supplied by the General Electric Company. When Lexan* material is used for the locator pin 137, the hole 139 may be left untapped and a self tapping screw used in connection therewith.
*Lexan—TMK General Electric Co.

Figure 3B:
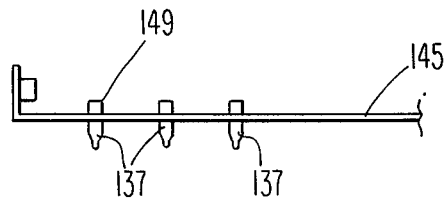
FIG. 3b is a top elevation of the back panel of FIG. 3a showing the locator pins and mounting PEM* nuts as well as the alignment thereof.
*TMK of Pennsylvania Engineering Company
Figure 3A:
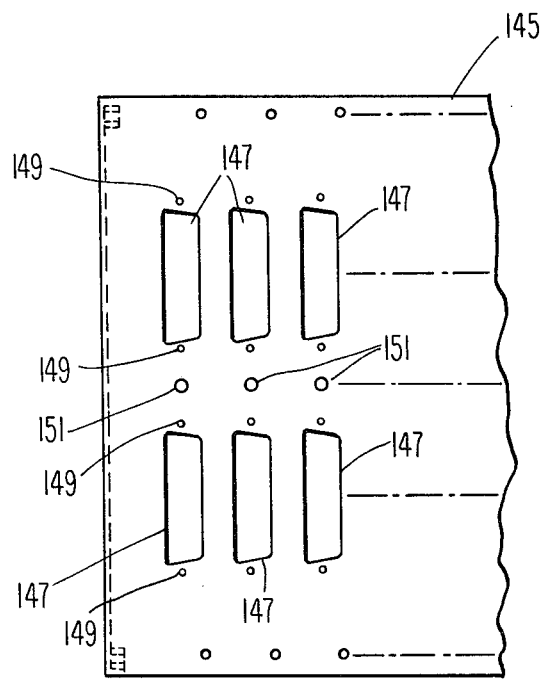
FIG. 3a shows the back panel of the cabinet including the interface connector punch-outs and mounting an alignment hardware.

The back panel 145 of a cabinet, housing the subject invention, is shown in an elevational view from its outside in FIG. 3a, and in a top elevation, in FIG. 3b. This back panel 145 is typically made of a flat sheet of metal such as aluminum or steel. A plurality of interface connector pushouts 147 are punched or machined into the back panel 145. When a P.C. board 101 uses a pair of pin connectors 117, the pushouts 147 are arranged in pairs and are of a shape and location to be properly aligned with the P.C. board connectors 117 when the board is fully inserted into the cabinet. The pushouts 147 provide openings through which the pin connectors 117 extend. Each pushout has associated with it a pair of PEM* nuts 149 which are positioned, one each, above and below the openings 147. These PEM* nuts are supplied by the Penn Engineering Company of Doylestown, Pa. and provide a mounting surface, projected from the external side of the back panel 145 for screw mounting user interface pin connectors. With this structure, a user may positively connect to a connector 117 which extends through the opening 147 created by the pushout 147. The user connector which is an interfacing (input/output) connector is positively mounted to and away from the surface of the back panel 145 of the cabinet. *PEM-TMK—Penn Engineering Company Screws 151 shown, in FIG. 3a, hold locator pins 137 shown positioned in FIG. 3b.

Figure 4:
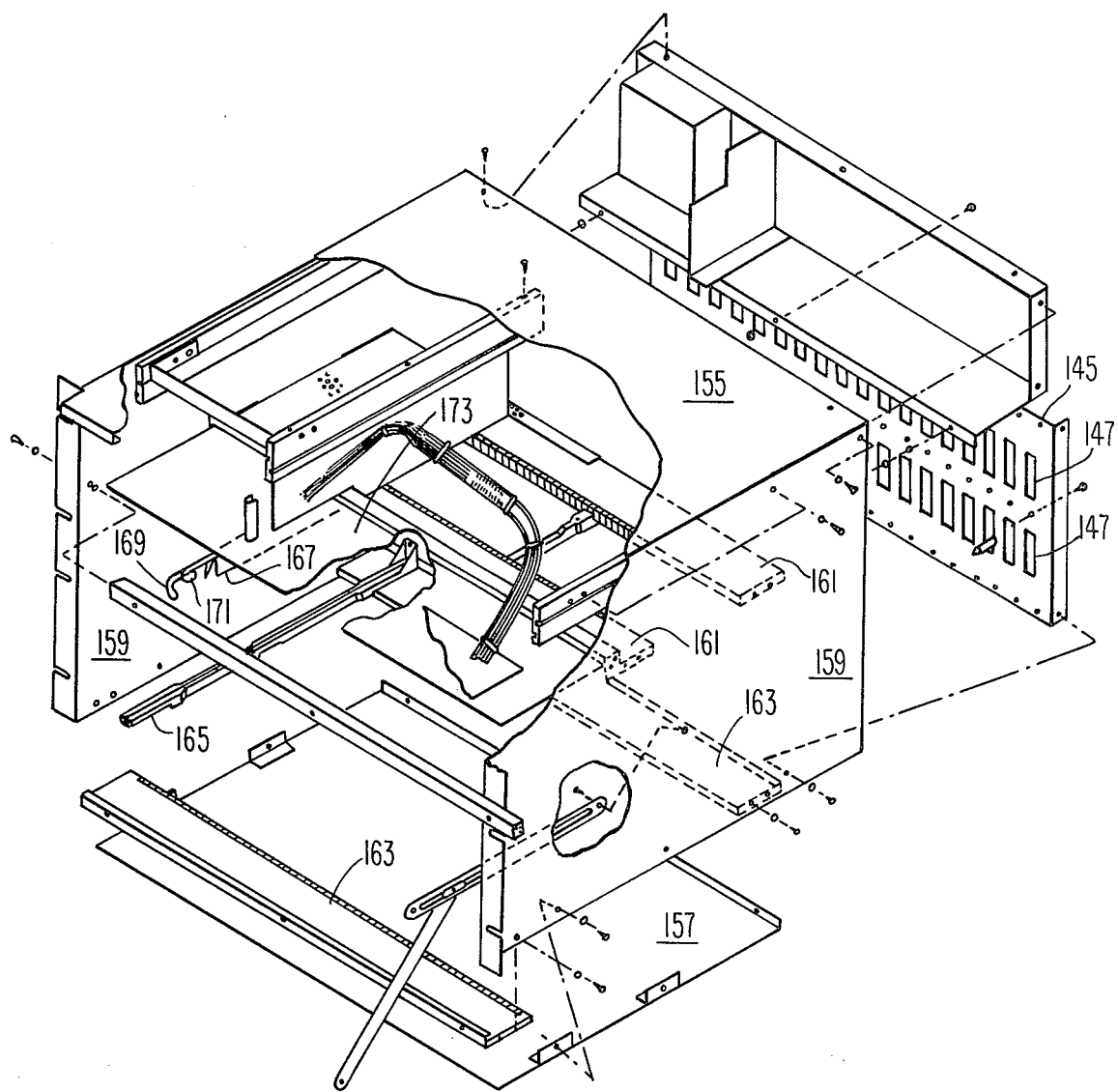
FIG. 4 shows an exploded view of a cabinet with the positions of the salient features of portions of the invention residing therein.

A cabinet 153, for housing an electronic unit, this cabinet containing the subject invention is shown in an exploded view in FIG. 4. The proper positions of the top 155, bottom 157 and side 159 panels of the cabinet 153 are easily recognized from this FIG. 4. The back panel 145, containing the pushout openings 147 and the locator pins 137, is also seen.

Top rails 161 and bottom rails 163 traverse the cabinet 153 from one side panel 159 to the other. A top and bottom guide 165 is positioned, respectively, each, on the top and bottom rails 161,163 for each P.C. board 101 which may be inserted in the cabinet 153. These guides 165 are aligned with each of the pushout holes 147 for perfectly aligning each P.C. board 101 with these pushouts holes 147. The number of guides 165 used corresponds to the number of board 101 positions and the ultimate capacity of the unit housed by the cabinet 153.

A zero insertion force (ZIF) type connector 167 is positioned along the front top rail 161 for connecting to each P.C. board 101. These ZIF connectors 167 may be obtained from AMP Corporation of Harrisburg, Pa. under Model No. 531015-3. Included as part of the ZIF connector 167 is an operating lever 169 and a cam key 171. The ZIF connector 167 operates to clamp against the P.C. board 101 ribbon connector 127 after the P.C. board 101 has been fully inserted into the cabinet 153 along the rails 165. The cam key 171 acts as a lock when the operating lever is positioned in the downward direction to cause the ZIF connector 167 to close on the ribbon connector 127. When the operating lever 169 is in the down position, the cam 171 engages the position locking slot 129 of a P.C. board 101 to hold the board fully into the cabinet and to properly position the ribbon connector 127 with respect to the ZIF connector 167.

An internal cabinet 153 top plane printed wiring board 173 provides wire connection to each of the plurality of ZIF connectors 167, for inter connecting any and all of the various P.C. boards 101 inserted into the cabinet 153.

The scheme described above provides a structure and method of interconnection of P.C. boards 101. The wiring and interconnection function, both inter-board and user interface (input/output) is bifurcated. The cabinet 153 top plane printed wiring board 173 or equivalent need be only large enough to provide interconnections beween actual and future P.C. boards 101. Interface connections and interface connectors need only be used as additional, actual, P.C. boards 101 are incorporated into the cabinet 153. The alignment of the guides 165, back panel pushout openings 147, locator pins 137 and locator block 119 assure that each P.C. board 101 is properly aligned and interconnected with user interface connectors mounted on back panel 147 PEM* nuts.
*PEM—TMK—Penn Engineering Company Each P.C. board 101 is easily removed by a technician through the front panel of the cabinet 153 by the release of the locking cam 171 and the opening of the ZIF connector 167. No mechanical attachment, whether it be screw release, bolt release, or alternative, need be incorporated into the back panel 147 or the interface connectors mounted thereon. The location of the positioning and locking slot 129 which mates with the locking cam 171 of the ZIF connector 167 is the only critical dimension needed to properly position the ribbon connector 127.

The P.C. boards 101 are locked into exact position with respect to the interface connectors whereby those interface connectors are mounted to the back panel 145 at the openings 147 and the P.C. boards are mounted on guides 165 in the cabinet 153. The internal board support structure of the cabinet 153 is in a specific and predetermined physical relationship to the back panel openings 147 to the board 101 mounted connectors 117 extend through the openings 147 for making interface connections.

The design at hand allows for reduced manufacturing cost for lower or entry level systems and does not necessitate the incorporation of additional cabinet connection hardware until the expansion of the unit is elected. The bifurcation into interface connections and inter-board connections, for the cabinet 153, does not significantly increase costs. In fact there is a tradeoff, as wiring costs increase geometrically as number of wires per harness increases arithmetically. Bifurcation, therefore tends to simplify initial assembly which may lead to cost benefits.

Changes can be made in the above-described invention without departing from the intent and scope thereof. Modifications can be made which provide equivalent structure. It is intended therefore, that all matter contained in the above description and shown in the accompanying drawings be interpreted as illustrative and not be taken in a limiting sense.

What is claimed:

1. An electrical signal interconnection apparatus providing interface connections and inter-component connections for an expandable capacity unit cabinet containing a plurality of said components, comprising:

first means, associated individually with each of said plural components, for making inter-component electrical signal connections, said first signal connection means being located at a first separate location on each said component;

means for adjustably mating with each said first signal connection means for providing inter-component signal connections, said signal connection mating means be fixedly and structurally associated with said cabinet and capable of expanded capacity mating and inter-component connections;

means for removably receiving, and positioning said expandable number of plural components;

second means, associated individually with each of said plural components, for making cabinet external interface signal connections, said second interface signal connection means being located at a second separate location on each said component, means for lockably engaging each said component for securedly holding same in said cabinet, and means for positioning and securedly holding interface signal connectors externally to said cabinet for mating with said second signal connection means.

2. The apparatus of claim 1 wherein said unit is of a type used for data communications, data terminals and data processing and said components are P.C. boards.

3. The apparatus of claim 2 wherein said first connection means includes a first connector positioned along a first edge of each said P.C. board, and said second connection means includes a second connector positioned along a second edge of each said P.C. board.

4. The apparatus of claim 3 wherein said receiving and positioning means includes a plurality of pairs of guides, each pair holding an individual respective board, said held boards being in aligned position to said interface connector positioning and securing means.

5. The apparatus of claim 4 wherein said adjustable mating and inter-component signal connecting means includes a plurality of zero insertion force connectors, one positioned with respect each guide pair for electrically mating with a respective P.C. board first connector.

6. The apparatus of claim 5 where said lockable engagment means includes a locking cam positioned on each said zero insertion force connector, and a slot adjacent to each said P.C. board first connector, said locking cam being capable of engaging said slot to lock a one of said P.C. boards into position.

7. The apparatus of claim 6 wherein each said zero insertion force connector includes an operating lever and wherein, each said locking cam is attached to a said operating lever.

8. The apparatus of claim 7 wherein said adjustable mating and inter-component signal connecting means also includes means for electrically interconnecting each zero insertion force connection.

9. The apparatus of claim 8 wherein said each first connector is a ribbon connector, and wherein said each second connector is a pin-type connector.

10. The apparatus of claim 9 wherein said each ribbon connector is positioned at the top plane edge of said each P.C. board and wherein said each pin-type connector is positioned at the back plane edge of said each P.C. board and extends beyond therefrom.

11. The apparatus of claim 10 wherein said receiving and positioning means also includes a locator block at each said P.C. board back plane edge and a locator pin matable with said locator block.

12. The apparatus of claim 11 wherein said interface connector positioning and molding means includes a plurality of openings in the back panel of said cabinet and a pair of mounting nuts adjacent to each said opening for securedly hold each interface connector at and away from the outside of said back panel.

13. The apparatus of claim 12 wherein said each P.C. board slot is located to align each said ribbon connector fingers with its respective zero insertion force connector and to position each said pin connector through a respective one of said back panel openings for mating with a respective interface connector holdable thereabout.

14. The apparatus of claim 13 wherein each said locator pin is positioned on the inside of said back panel adjacent to a said opening therethrough.

15. The apparatus of claim 14 wherein each said ribbon connector fingers is nominally 0.10 inches wide.

* * * * *